United States Patent [19]

Ishida

[11] Patent Number: 5,617,368
[45] Date of Patent: Apr. 1, 1997

[54] SEMICONDUCTOR MEMORY DEVICE EQUIPPED WITH SERIAL DATA READING CIRCUIT AND METHOD OF OUTPUTTING SERIAL DATA FROM SEMICONDUCTOR MEMORY

[75] Inventor: Yoshiyuki Ishida, Kasugai, Japan

[73] Assignee: Fujitsu Limited, Kawasaki, Japan

[21] Appl. No.: 533,788

[22] Filed: Sep. 26, 1995

[30] Foreign Application Priority Data

Oct. 6, 1994 [JP] Japan .................................. 6-243134

[51] Int. Cl.[6] .................................................. G11C 7/00
[52] U.S. Cl. ........................ 365/221; 365/73; 365/230.09; 365/236; 365/240
[58] Field of Search ................................ 365/73, 230.09, 365/221, 240, 236

[56] References Cited

U.S. PATENT DOCUMENTS 5,307,323  4/1994  Fukuda et al. ........................ 365/221
5,377,155  12/1994  Tamaki et al. ........................ 365/221

*Primary Examiner*—David C. Nelms
*Assistant Examiner*—F. Niranjan
*Attorney, Agent, or Firm*—Staas & Halsey

[57] ABSTRACT

A semiconductor memory device for serially outputting previously loaded data from an integral memory is disclosed herein. The device is configured to output head data from a predetermined location in the memory by latching the head data directly from a common bus. In a preferred embodiment the head data is latched by a single latch circuit. In a method of the invention, the head data is transferred directly from a predetermined memory address onto a common bus. A latch circuit then latches the head data from the common bus. The latched head data is next presented to an output buffer. Thereafter, data is presented in a serial form from a plurality of serial registers to the output buffer.

9 Claims, 10 Drawing Sheets

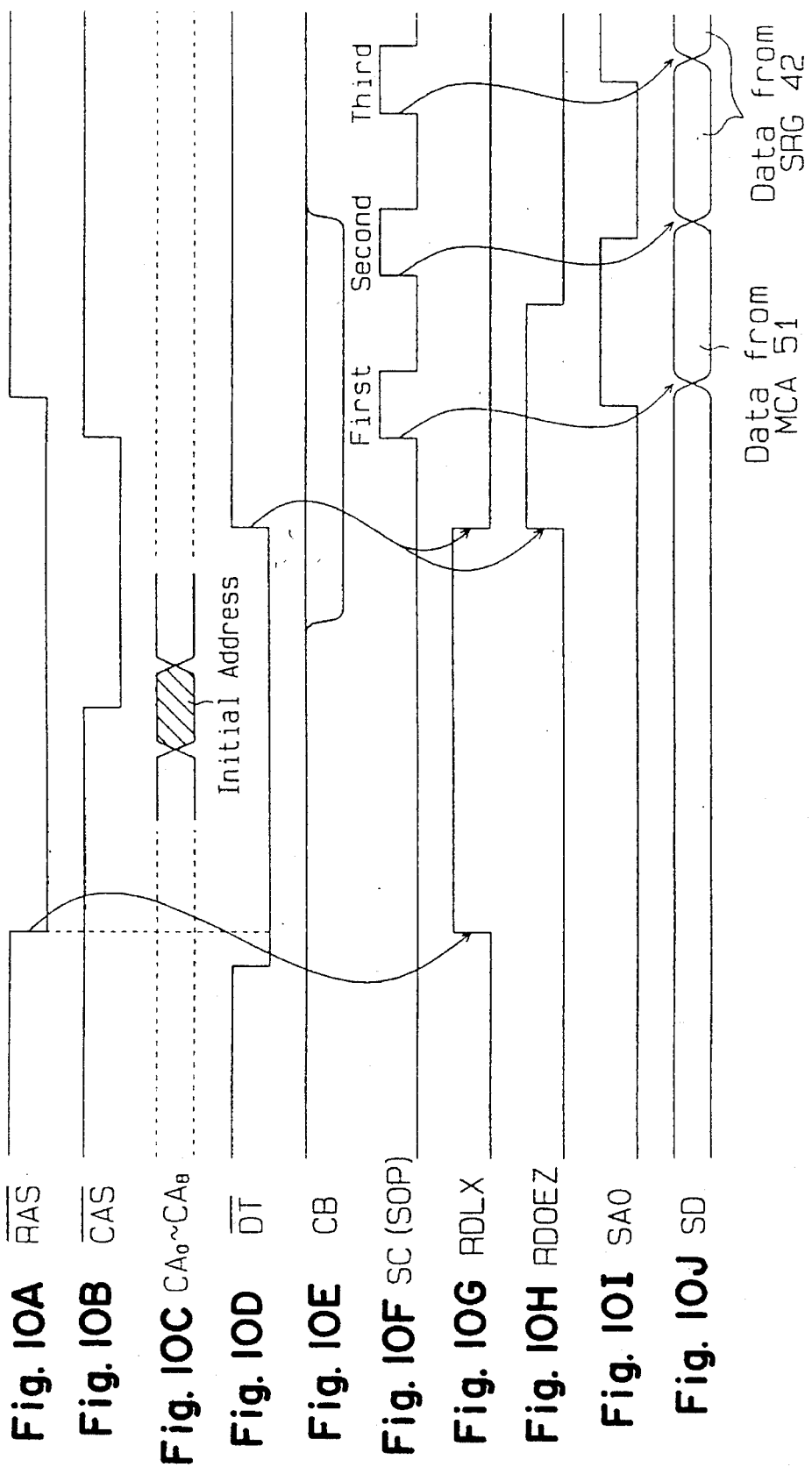

SEMICONDUCTOR MEMORY DEVICE EQUIPPED WITH SERIAL DATA READING CIRCUIT AND METHOD OF OUTPUTTING SERIAL DATA FROM SEMICONDUCTOR MEMORY

BACKGROUND OF THE INVENTION

1. Field of the Invention

The present invention relates generally to a semiconductor memory equipped with a serial data reading circuit, and a method of outputting serial data from a semiconductor memory. More particularly, this invention relates to an improvement which minimizes the circuit area in a semiconductor memory device like a video random access memory (VRAM).

2. Description of the Related Art

Recently, high resolution and multicolor techniques have been improved for graphics displays used in TV's, VTR's and personal computers. It is therefore demanded that a video random access memory (VRAM) should have a larger capacity, and faster and higher performances. The ever-increasing performance of VRAM's increases the circuit area in those devices, thus enlarging the devices. To avoid the undesirable enlargement of such devices, it is important to suppress the increase in circuit area on designing semiconductor memory devices.

FIG. 1 shows a block circuit of a typical VRAM. The VRAM includes a RAM (Random Access Memory) section 31 and an SAM (Serial Access Memory) section 41.

The RAM section 31 includes a memory section 32, an input circuit 33, a column address buffer 34, a row address buffer 35, a row decoder 36, a column decoder 37, a sense amplifier 38 and a RAM input/output (I/O) buffer 39.

The memory section 32, which will be discussed later in detail, includes a plurality of memory cells (not shown) arranged in a two-dimensional array. Each memory cell stores 1-bit information. The input circuit 33 receives various externally supplied signals such as a row address strobe signal/RAS, and generates various enable signals and various control signals, based on the various input signals.

The column address buffer 34 and row address buffer 35 receive externally supplied address signals $A_0$ to $A_8$. The row address buffer 35 latches the input address signals $A_0$ to $A_8$ in response to the row address strobe signal /RAS and supplies the latched address signals $A_0$ to $A_8$ as row address signals $RA_0$ to $RA_8$ to the row decoder 36. Based on the row address signals $RA_0$ to $RA_8$, the row decoder 36 selects one of word lines WL in the memory section 32. Data stored in individual memory cells which are connected to the selected word line WL are output on an associated pair of bit lines BL and /BL.

The column address buffer 34 latches the input address signals $A_0$ to $A_8$ in response to a column address strobe signal /CAS and supplies the latched address signals $A_0$ to $A_8$ as column address signals $CA_0$ to $CA_8$ to the column decoder 37. Based on the column address signals $CA_0$ to $CA_8$, the column decoder 37 selects one of multiple bit line pairs BL and /BL.

As a word line WL and bit line pair BL and /BL are selected, one memory cell is specified. One of data $D_1$ to $D_8$ can be written via the RAM I/O buffer 39 into the specified memory cell by an external device (not shown), via sense amplifier 38. Data (e.g., $D_1$) stored in the specified memory cell can be output to an external device via the sense amplifier 38, a common bus CB and the I/O buffer 39.

The SAM section 41 includes a serial register group 42, a transfer gate group 43, a transfer controller 44, a serial address counter 45, a serial decoder 46 and a SAM I/O buffer 47.

The serial register group 42 includes a plurality of registers which are connected via the associated transfer gates to the associated bit line pairs BL and/BL of the memory section 32. The switching of the individual gates in the transfer gate group 43 is controlled by the transfer controller 44. The transfer controller 44 controls the transfer gate group 43 based on at least one of the control signals produced by the input circuit 33. Cell data stored in the memory cells which are connected to one selected word line WL are transferred via the transfer gates to the serial register group 42. The data transfer to the serial register group 42 from the memory section 32 is generally called read transfer.

The serial register group 42 can provide the memory section 32 with data, stored in its registers, via the transfer gate group 43. Individual pieces of data are stored in the memory cells which are connected to a selected one word line WL. The data transfer to the memory section 32 from the serial register group 42 is generally called write transfer.

The selection of the read transfer or write transfer is made based on the row address strobe signal /RAS and a write enable signal /WE. More specifically, when the write enable signal /WE has a high (H) level upon the falling of the row address strobe signal /RAS to a low (L) level, the read transfer mode is selected. When the write enable signal /WE has an L level upon the falling of the row address strobe signal /RAS to the L level, on the other hand, the write transfer mode is selected.

The serial address counter 45 receives the column address signals $CA_0$ to $CA_8$ from the column address buffer 34 and an externally supplied system clock signal SC. The counter 45 sets an initial address used for reading data from the serial register group 42, based on the column address signals $CA_0$ to $CA_8$. The counter 45 supplies the serial address signals $SA_0$ to $SA_8$ indicative of this initial address to the serial decoder 46. The counter 45 counts the number of pulses in the system clock signal SC, and outputs the serial address signals $SA_0$–$SA_8$ indicating a new address which is obtained by adding the count value to the initial address. In other words, the counter 45 outputs such serial address signals $SA_0$–$SA_8$ that the address value indicative of those serial address signals $SA_0$–$SA_8$ is incremented by one every time one pulse of the system clock signal SC is input to the counter 45, to the serial decoder 46.

The serial decoder 46 selects a pair of bit lines BL and /BL based on the serial address signals $SA_0$–$SA_8$. The register in the serial register group 42, which is connected to the selected bit line pair BL and /BL, outputs data, stored in itself, as serial output data (e.g., $SD_1$) via the SAM I/O buffer 47.

FIG. 2 shows the memory section 32 and peripheral circuits which are coupled thereto. As shown in FIG. 2, the memory section 32 consists of two blocks 32a and 32b. A circuit section 50 is for reading output data $D_1$ (one of eight output data $D_1$–$D_8$) from the memory section 32, and includes a RAM output buffer 55 which is a part of the RAM I/O buffer 39. A circuit section 60 reads serial output data $SD_1$ (one of eight output data $SD_1$–$SD_8$) from the serial register group 42, and includes a SAM output buffer 64 which is a part of the SAM I/O buffer 47.

Each of the blocks 32a and 32b includes a memory cell array (MCA) 51, first and second sense buffers 52 and 53, and a common bus driver 54. The selection of the block 32a or the block 32b is made by the row address signal $RA_8$. For instance, when the row address signal $RA_8$ is at an L level, the block 32a is selected. When the row address signal $RA_8$ is at an H level, the block 32b is selected. For the unselected block, the voltage supplied to this block is controlled down to a low potential to save the power consumption.

The common bus drivers 54 of the blocks 32a and 32b are connected via the common bus CB to the RAM output buffer 55. Data which is output from the selected block 32a or 32b is output as output data $D_1$ to an external circuit via the common bus CB and RAM output buffer 55.

The common bus CB is connected to a P channel MOS transistor 56 for resetting the potential of the bus CB. This MOS transistor 56 has a drain connected to the common bus CB, a source connected to a high-potential power supply $V_{CC}$ and a gate connected to the output terminal of a NOR gate 57. The NOR gate 57 receives a reset signal RST and a control signal RTRZ. The reset signal RST is set high when the row address strobe signal /RAS has an H level. The control signal RTRZ indicates that the mode becomes the read transfer mode, and is generated by the input circuit 33 shown in FIG. 1. The input circuit 33 outputs the H-level control signal RTRZ when a data transfer signal /DT has an L level at the falling timing of the row address strobe signal /RAS. When the row address strobe signal /RAS has an H level or the mode is the read transfer mode, therefore, the potential of the common bus CB is reset to the high-potential voltage $V_{CC}$.

As shown in FIG. 2, the serial register group (SRG) 42 is connected to latch type first and second sense buffers 61 and 62 which assist faster data reading.

FIG. 4 presents the detailed illustration of the serial register group 42 and its peripheral circuits. Individual registers 42a in the SRG 42 are connected via associated transfer gates 42b to a first pair of serial data bus lines $SDB_1$ and $/SDB_1$ or a second pair of serial data bus lines $SDB_2$ and $/SDB_2$. Each transfer gate 42b is constituted of an N channel MOS transistor. The serial decoder 46 controls the switching of the individual transfer gates 42b based on the serial address signals $SA_1$-$SA_8$. Data stored in one of two adjoining registers 42a is transferred to the first sense buffer 61 via the first serial data bus line pair $SDB_1$ and $/SDB_1$, while data stored in the other register 42a is transferred to the second sense buffer 62 via the second serial data bus line pair $SDB_2$ and $/SDB_2$.

The first and second sense buffers 61 and 62 latch data from the registers 42a and output the latched data to a common bus driver 63 shown in FIG. 2. The common bus driver 63 receives the serial address signal $SA_0$. When the serial address signal $SA_0$ is set low, the common bus driver 63 outputs the data, latched in the first sense buffer 61, as serial data $SD_1$ via the SAM output buffer 64. When the serial address signal $SA_0$ is set high, the common bus driver 63 outputs the data, latched in the second sense buffer 62, as serial data $SD_1$ via the SAM output buffer 64. The alternate outputting of the data latched in the first and second sense buffers 61 and 62 speeds up the data reading from the SRG 42.

To ensure fast image drawing on a graphics display, data should be read from the SRG 42 of the VRAM at a high speed. In particular, it is demanded to speed up the data reading after the read transfer to the SRG 42 from each memory cell array (MCA) 51 or shorten the time required for outputting the first data in the SRG 42 as serial data $SD_1$ from the SAM output buffer 64.

It however takes time to transfer data to the SRG 42 from the MCA 51. If the system clock SC is supplied immediately after the read transfer, data to be read from the SRG 42 may become insufficient or data previously read may be undesirably read again.

Circuit section 60 is directed toward avoiding such uncertain data reading while speeding up the data reading process. In circuit section 60, two latch circuits 65 and 66 are provided. The first latch circuit 65 is connected between the common bus driver 63 and the first sense buffer 52 of each of the blocks 32a and 32b. The second latch circuit 66 is connected between the common bus driver 63 and the second sense buffer 53 of each block 32a or 32b. In transferring data to the SRG 42 from the MCA 51, the RAM section 31 supplies data, read according to the initial address, to the common bus driver 63 via the first or second sense buffer 52 or 53 and the latch circuit 65 or 66.

FIG. 3 shows a part of the memory section 32. The column decoder 37 selects two bit line pairs BL and /BL based on the column address signals $CA_1$-$CA_8$. Data in the cells associated with the selected two bit line pairs are respectively transferred to the latch circuits 65 and 66 via the data bus line pair $DB_1$ and $/DB_1$, the data bus line pair $DB_2$ and $/DB_2$, and the first and second sense buffers 52 and 53. The latch circuits 65 and 66 latch the transferred data.

In response to the serial address signal $SA_0$ (originating from the column address signal $CA_0$), the common bus driver 63 for the SRG 42 selects one of the latch circuits 65 and 66 and outputs the data from the selected latch circuit as output data $SD_1$ at the initial address.

While this output data $SD_1$ is being output, data transfer to the SRG 42 from the MCA 51 is completed. The serial address counter 45 outputs the serial address signals $SA_0$-$SA_8$, associated with a new address (initial address+1) based on the counted pulses of the clock signal SC, to the serial decoder 46.

Based on those serial address signals, the serial decoder 46 selects two registers 42a. Data in the selected two registers 42a are transferred to the sense buffers 61 and 62 via the serial data bus line pairs $SDB_1$ and $/SDB_1$ and $SDB_2$ and $/SDB_2$, respectively. The sense buffers 61 and 62 latch the transferred data.

The common bus driver 63 selects one of the sense buffers 61 and 62 in response to the serial address signal $SA_0$, and allows the output buffer 64 to output the data from the selected sense buffer as output data $SD_1$ at the address "initial address+1".

During the data transfer to the SRG 42 from the MCA 51, the output data $SD_1$ at the initial address is supplied to the SAM output buffer 64 in the above manner. This scheme increases the data-reading speed immediately after data transfer with a reliability.

Since the above-discussed VRAM is designed to output 8-bit serial output data $SD_1$-$SD_8$, however, the read circuit 60 which includes the latch circuits 65 and 66 is also provided for each of the other seven serial output data $SD_2$-$SD_8$. This circuit design considerably increases the necessary circuit area in the VRAM chip.

SUMMARY OF THE INVENTION

Accordingly, it is a primary objective of the present invention to provide a semiconductor memory device equipped with a data reading circuit which suppresses an increase in circuit area and shortens the time for reading serial data stored in a serial register.

To achieve the foregoing and other objects and in accordance with the purpose of the present invention, an improved semiconductor memory device is provided.

The semiconductor memory device according to the present invention, as shown in FIG. 5, includes a memory cell array 1 having a plurality of memory cells connected to a plurality of word lines, and a random access data reading circuit 50 and a serial access data reading circuit 60 which are coupled to the memory cell array 1. The random access data reading circuit 50 reads cell data from a memory cell selected based on a row address signal RA and a column address signal CA. The random access circuit 50 includes a random access sense buffer 3 and a random access common bus driver 5 and a random access output buffer 6 connected via a common bus CB to the random access common bus driver 5. The serial access data reading circuit 60 reads cell data from memory cells, connected to a word line of the memory cell array 1 selected based on the row address signal RA in a read transfer mode. The serial access data reading circuit 60 includes a serial address counter 8, a serial resister group (SRG) 2 and a serial access sense buffer 9. The serial resister group (SRG) 2 is provided with a plurality of serial registers for storing data supplied from individual memory cells as read from the selected word line. The serial access sense buffer 9, coupled to the plurality of serial registers 2, receives data signal selectively supplied from the serial registers in accordance with an address value of the serial address counter 8. The serial access data reading circuit 60 further includes a serial access common bus driver 10, a serial access output buffer 11 and a single latch circuit 12. The latch circuit 12 is connected to the common bus CB of the random access data reading circuit 50, and latches an initial data signal placed on the common bus CB by the random access common bus driver 5 in the read transfer mode. The serial access common bus driver 10 is coupled to the serial access sense buffer 9, the latch circuit 12 and the serial access output buffer 11. The common bus driver 10 supplies the initial data signal latched in the latch circuit 12 to the serial access output buffer 11 first, and then supplies data signals from the serial register group 2 to the serial access output buffer 11 via the serial access sense buffer 9.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

FIGS. 10A–10J are timing charts illustrating the operation of the VRAM in FIG. 6.

DETAILED DESCRIPTION OF THE PREFERRED EMBODIMENTS

Figure 1:
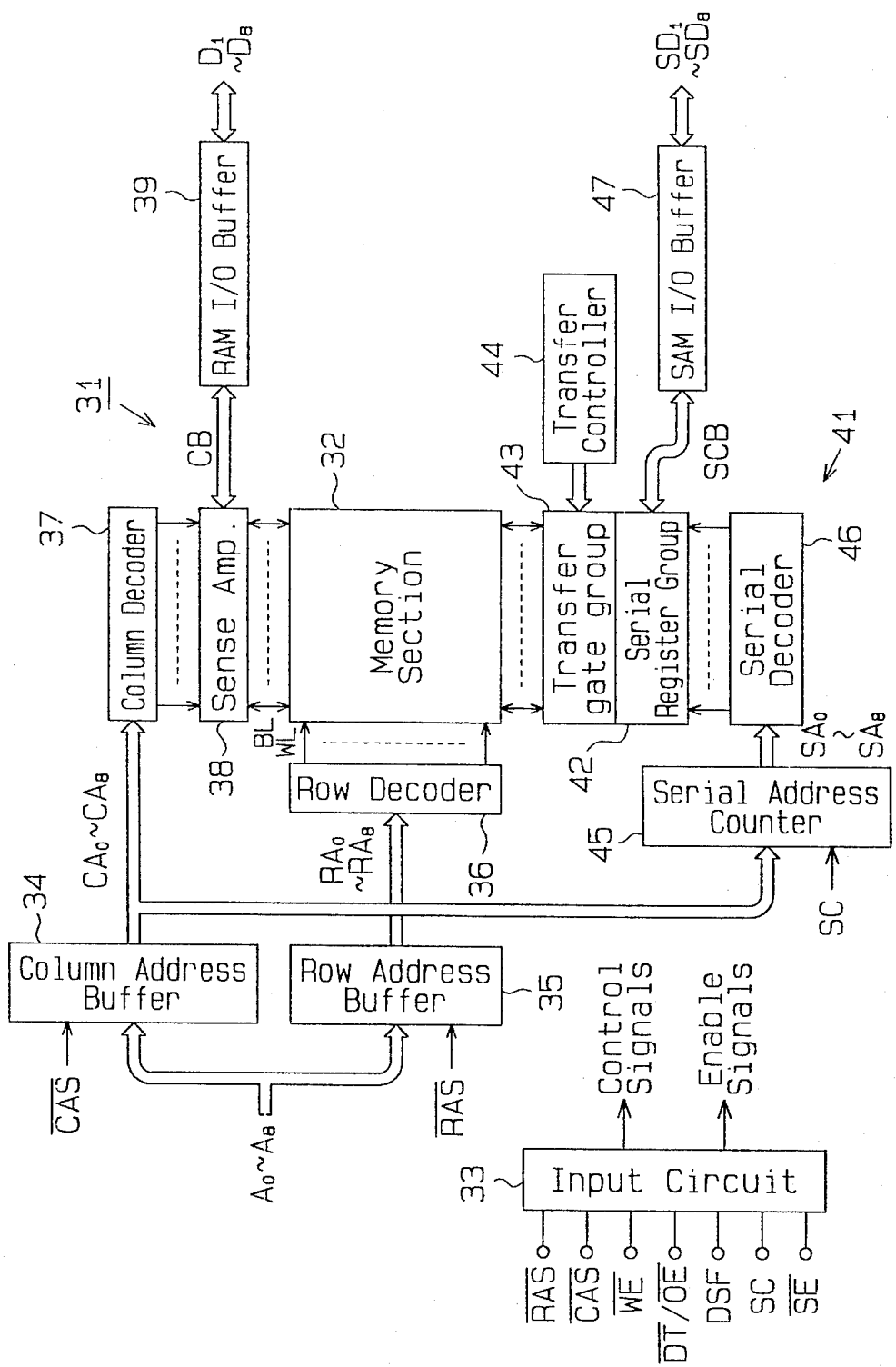
FIG. 1 is a schematic block circuit diagram showing a conventional VRAM.
Figure 6:
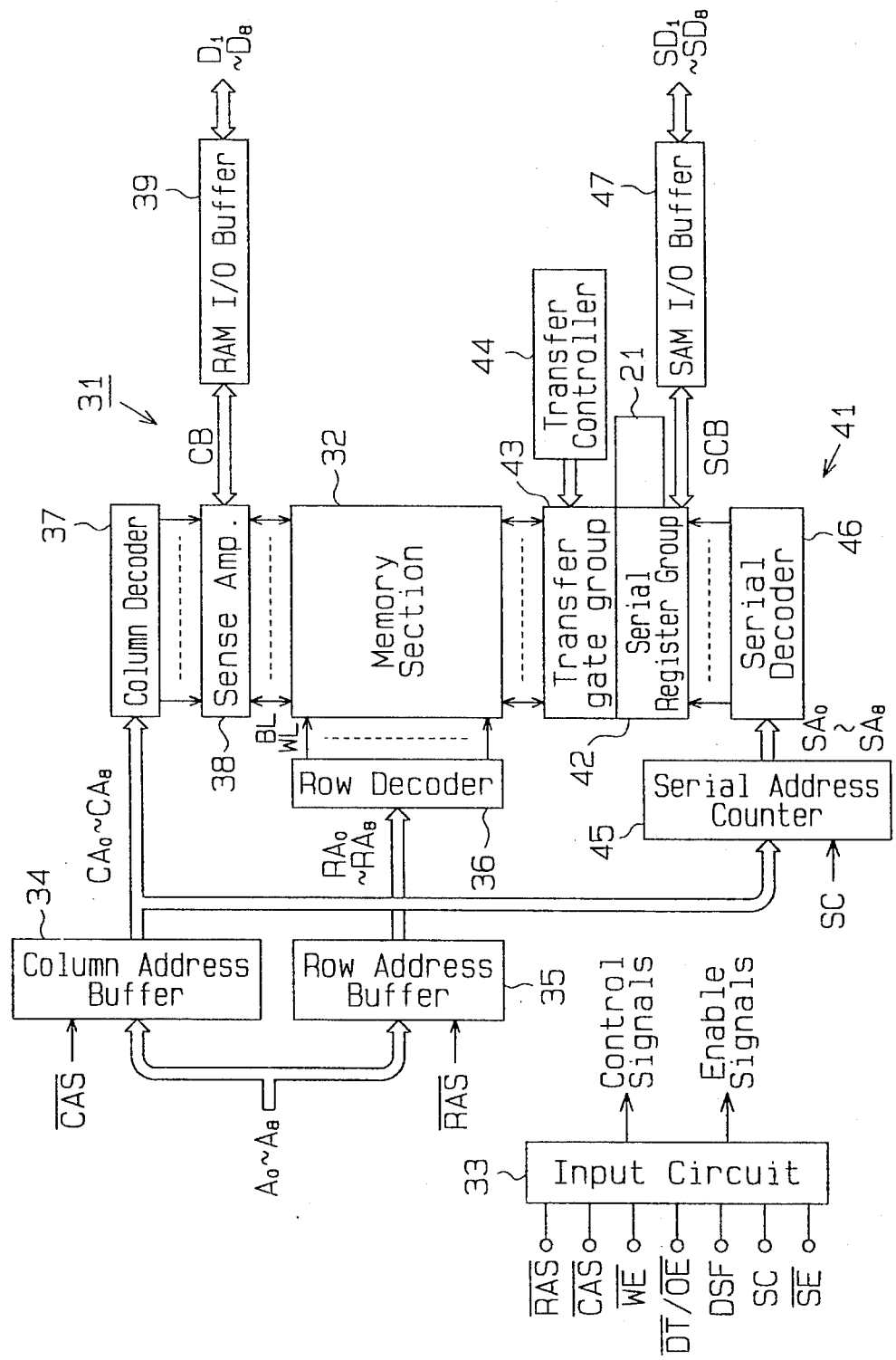
FIG. 6 is a schematic block circuit diagram showing a VRAM according to an embodiment of this invention.

A VRAM according to one embodiment of the present invention will now be described with reference to FIGS. 6 through 10. FIG. 6 shows the schematic structure of a VRAM as a semiconductor memory device according to this embodiment. The VRAM in FIG. 6 is substantially the same as the conventional VRAM in FIG. 1, but differs from the conventional art in that the serial register group 42 is coupled to a single latch circuit 21. The same reference numerals as used for the conventional art will also be used to denote corresponding or identical components of this embodiment in FIG. 6 to avoid repeating their descriptions. The following is the detailed description of a reading circuit section which is one feature of this invention.

Figure 7:
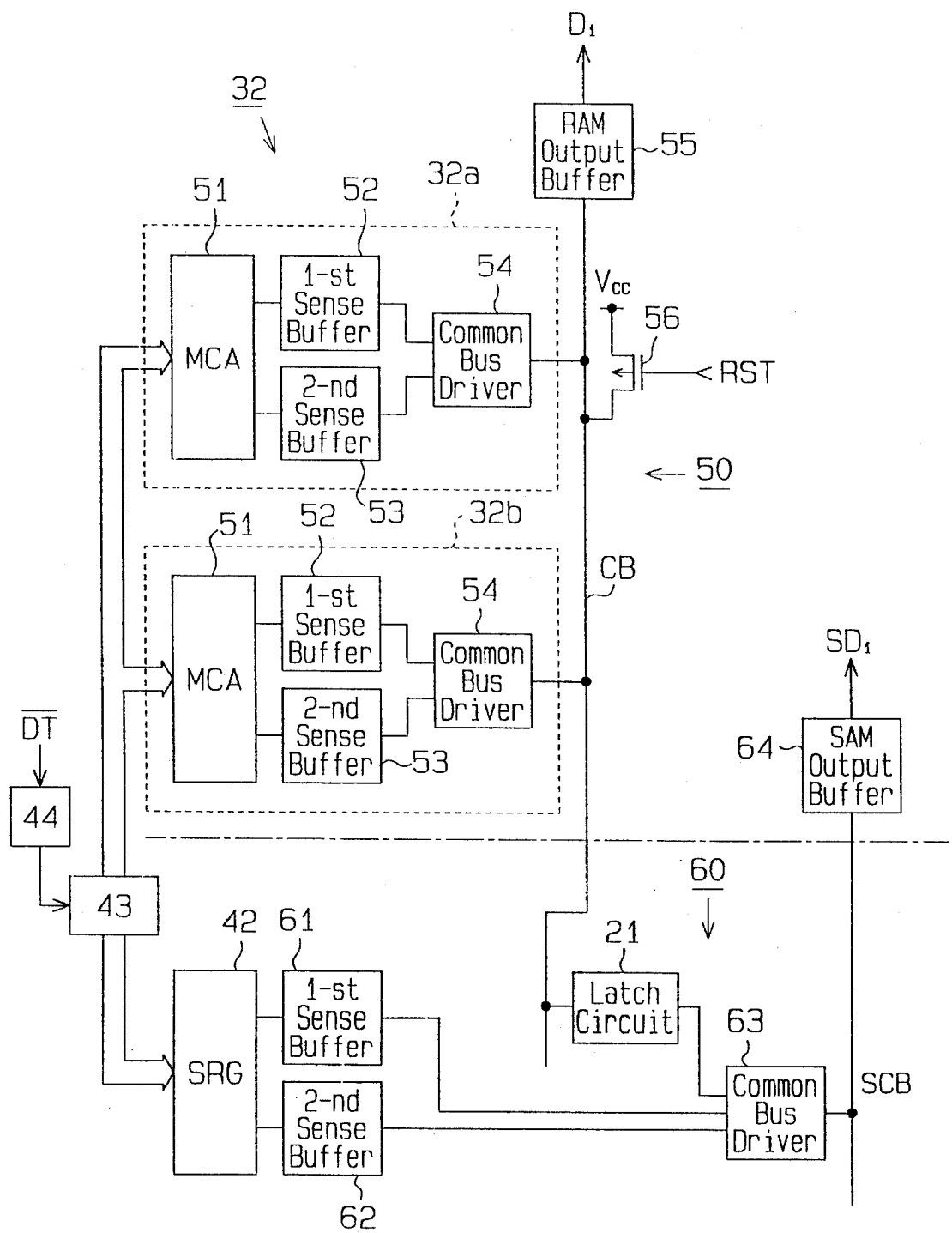
FIG. 7 is a circuit diagram showing a data reading section in the VRAM in FIG. 6.

FIG. 7 shows a memory section 32, a serial register group (SRG) 42 and its peripheral circuits. The latch circuit 21 is connected to a common bus CB which is connected to a RAM output buffer 55 and two common bus drivers 54. Data read from each block 32a or 32b is supplied via the common bus CB to the output buffer 55, which in turn outputs the received data as output data $D_1$.

The common bus CB is connected to a P channel MOS transistor 56 which serves to reset the potential of the common bus. The MOS transistor 56 has a source connected to a high-potential power supply $V_{CC}$ and a gate which receives a reset signal RST from an input circuit 33 in FIG. 6. The input circuit 33 outputs, as the reset signal RST, a signal obtained by delaying a row address strobe signal /RAS by a given time. That is, the input circuit 33 outputs the L-level reset signal RST when the row address strobe signal /RAS goes low, and when the row address strobe signal /RAS goes high, the input circuit 33 outputs the H-level reset signal RST after a predetermined delay time. Accordingly, the MOS transistor 56 is turned on with a predetermined delay time after the row address strobe signal /RAS goes high. As the MOS transistor 56 is turned on, the potential of the common bus CB is reset by the high-potential power supply $V_{CC}$. This reset potential continues until the row address strobe signal /RAS goes low next time.

Figure 8:
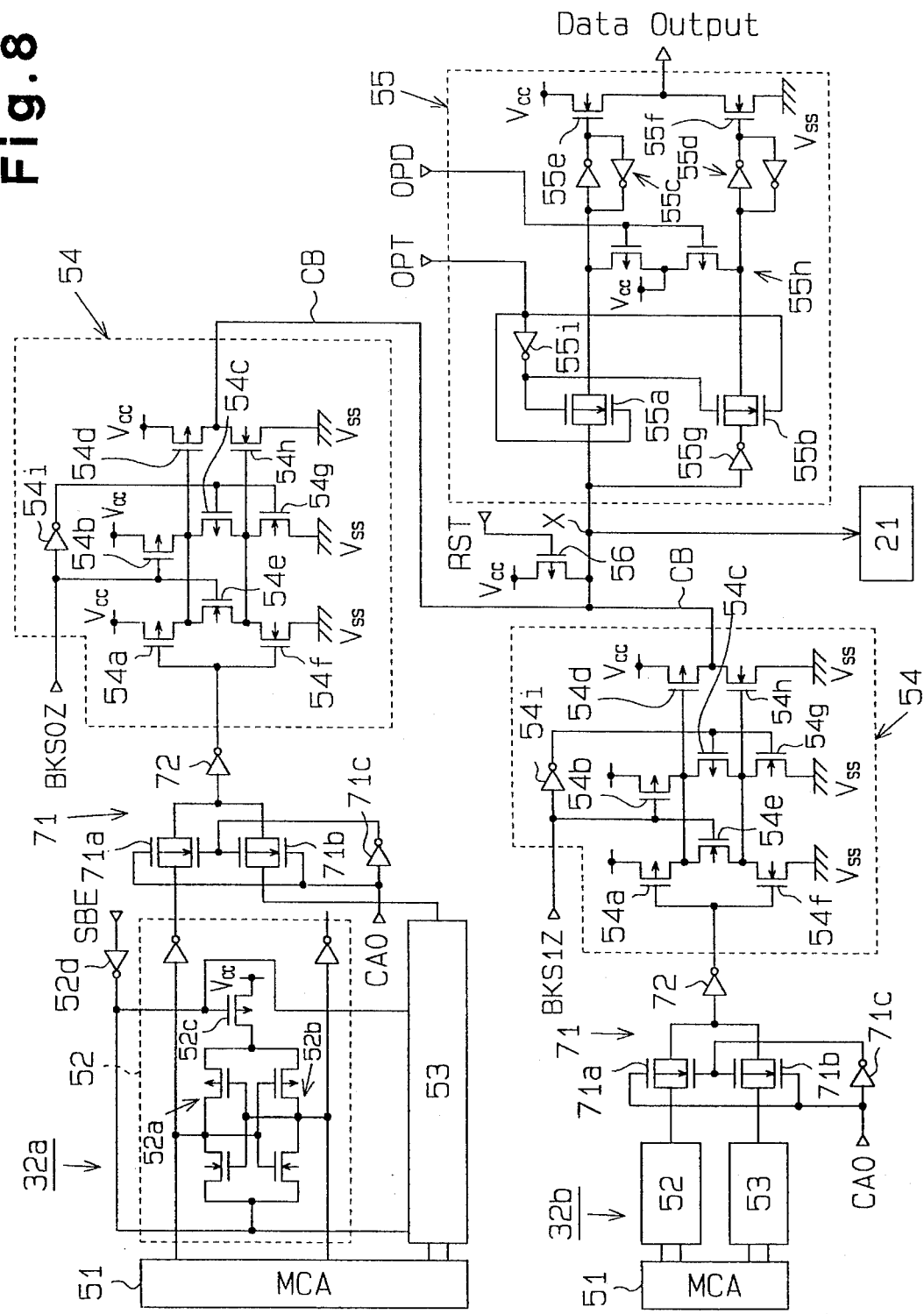
FIG. 8 is a diagram showing a reading circuit in a random access memory section.

FIG. 8 presents the detailed illustration of a circuit section 50 for a RAM section 31. FIG. 8 shows blocks 32a and 32b of a memory section 32 and a RAM output buffer 55 in detail.

A first sense buffer 52 in each of the blocks 32a and 32b includes two inverters 52a and 52b, each of which comprises a pair of P channel and N channel MOS transistors. The input terminal of one of the two inverters 52a and 52b is connected to the output terminal of the other inverter. The first sense buffer 52 further includes a P channel MOS transistor 52c, which has a drain connected to the two inverters 52a and 52b, a source connected to the high-potential power supply $V_{CC}$ and a gate connected to an inverter 52d. An enable signal SBE is input to the gate of the transistor 52c via the inverter 52d. This enable signal SBE is generated by the input circuit 33.

In response to an H-level enable signal SBE, the PMOS transistor 52c is turned on to supply the high-potential voltage $V_{CC}$ to the inverters 52a and 52b. The first sense buffer 52 is therefore enabled by the H-level enable signal SBE. The enabled first sense buffer 52 amplifies input data from an MCA 51 and supplies it to a selector 71. Since a second sense buffer 53 in each block 32a or 32b has the same structure as the first sense buffer 52, its illustration and description will be omitted.

The selector 71 includes two transfer gates 71a and 71b, each of which is constituted of P channel and N channel MOS transistors. A column address signal $CA_0$ is input directly or via an inverter 71c to the gates of the transfer gates 71a and 71b. When the column address signal $CA_0$ has an L level, therefore, only the transfer gate 71a is turned on. The enabled transfer gate 71a provides the common bus driver 54 with data from the first sense buffer 52 via an inverter 72. On the other hand, when the column address signal $CA_0$ has an H level, only the transfer gate 71b is turned on. The enabled transfer gate 71b provides the common bus driver 54 with data from the second sense buffer 53 via the inverter 72.

The common bus driver 54 includes four PMOS transistors 54a to 54d, four NMOS transistors 54e to 54h and an inverter 54i. The PMOS transistor 54a and two NMOS transistors 54e and 54f are connected in series between the high-potential power supply $V_{CC}$ and low-potential power supply $V_{SS}$. The two PMOS transistors 54b and 54c and NMOS transistor 54g are connected in series between the high-potential power supply $V_{CC}$ and low-potential power supply $V_{SS}$. The PMOS transistor 54d and NMOS transistor 54h are connected in series between the high-potential power supply $V_{CC}$ and low-potential power supply $V_{SS}$.

A data signal from the first or second sense buffer 52 or 53 is input via the selector 71 to the gate of the PMOS transistor 54a and the gate of the NMOS transistor 54f. The drain of the PMOS transistor 54a is connected between the PMOS transistor 54b and PMOS transistor 54c and is also connected to the gate of the PMOS transistor 54d.

The drain of the NMOS transistor 54f is connected between the PMOS transistor 54c and NMOS transistor 54g, and is also connected to the gate of the NMOS transistor 54h. An enable signal BKS0Z is input to the gate of the PMOS transistor 54b and the gate of the NMOS transistor 54e. The enable signal BKS0Z is input to the gate of the PMOS transistor 54c and to the gate of the NMOS transistor 54g via the inverter 54i. The common bus driver 54 associated with the block 32b receives an enable signal BKS1Z.

The enable signals BKS0Z and BKS1Z are generated by the input circuit 33 based on the row address signal $RA_8$ and the row address strobe signal /RAS. When the row address strobe signal /RAS has an H level, the input circuit 33 sets the enable signals BKS0Z and BKS1Z low. When the row address strobe signal /RAS has an L level and the row address signal $RA_8$ has an L level, the input circuit 33 generates the H-level enable signal BKS0Z and the L-level enable signal BKS1Z. When the row address strobe signal /RAS has an L level and the row address signal $RA_8$ has an H level, the input circuit 33 generates the L-level enable signal BKS0Z and the H-level enable signal BKS1Z.

With the enable signal BKS0Z high, the transistors 54b and 54g turn off and the transistors 54c and 54e turn on. Consequently, the inverter, which is constituted of the PMOS transistor 54a and NMOS transistor 54f, supplies the data signal from the selector 71 to another inverter, which is constituted of the PMOS transistor 54d and NMOS transistor 54h. The inverter constituted of the PMOS transistor 54d and NMOS transistor 54h provides the output buffer 55 with the received data signal via the common bus CB. That is, the two-stage bus drivers amplify the data signal from the selector 71 and output the amplified signal to the output buffer 55 and the latch circuit 21.

With the enable signal BKS0Z low, on the other hand, the transistors 54b and 54g turn on and the transistors 54c and 54e turn off. Consequently, the transistors 54d and 54h are turned off, setting the common bus CB in a high-impedance state. This permits the common bus CB to transfer data output from the other common bus driver 54.

The RAM output buffer 55 includes two transfer gates 55a and 55b, two latch circuits 55c and 55d, two output transistors 55e and 55f, two inverters 55g and 55i, and a reset circuit 55h. The output buffer 55 outputs data from the common bus drivers 54 as output data $D_1$.

A control signal OPT from the input circuit 33 is input directly or via the inverter 55i to the gate terminals of the two transfer gates 55a and 55b. The transfer gates 55a and 55b are turned on in response to an H-level control signal OPT. The transfer gate 55a supplies the data signal from each common bus driver 54 to the gate of the output transistor 55e via the latch circuit 55c. The transfer gate 55b receives the data signal from each common bus driver 54 via the inverter 55g, and supplies it to the gate of the output transistor 55f via the latch circuit 55d. Both output transistors 55e and 55f are of an NMOS type and are connected in series between the high-potential power supply $V_{CC}$ and low-potential power supply $V_{SS}$.

The reset circuit 55h, which is connected between the output terminals of the two transfer gates 55a and 55b, comprises two PMOS transistors. A control signal OPD from the input circuit 33 is input to the gates of those PMOS transistors. In response to an L-level control signal OPD, the reset circuit 55h connects the input side of each latch circuit 55c or 55d to the high-potential power supply $V_{CC}$. As a result, the output transistors 55e and 55f are turned off in response to an L-level signal which is supplied to the transistors 55e and 55f. This sets the output of the output buffer 55 in a high-impedance state.

Figure 9:
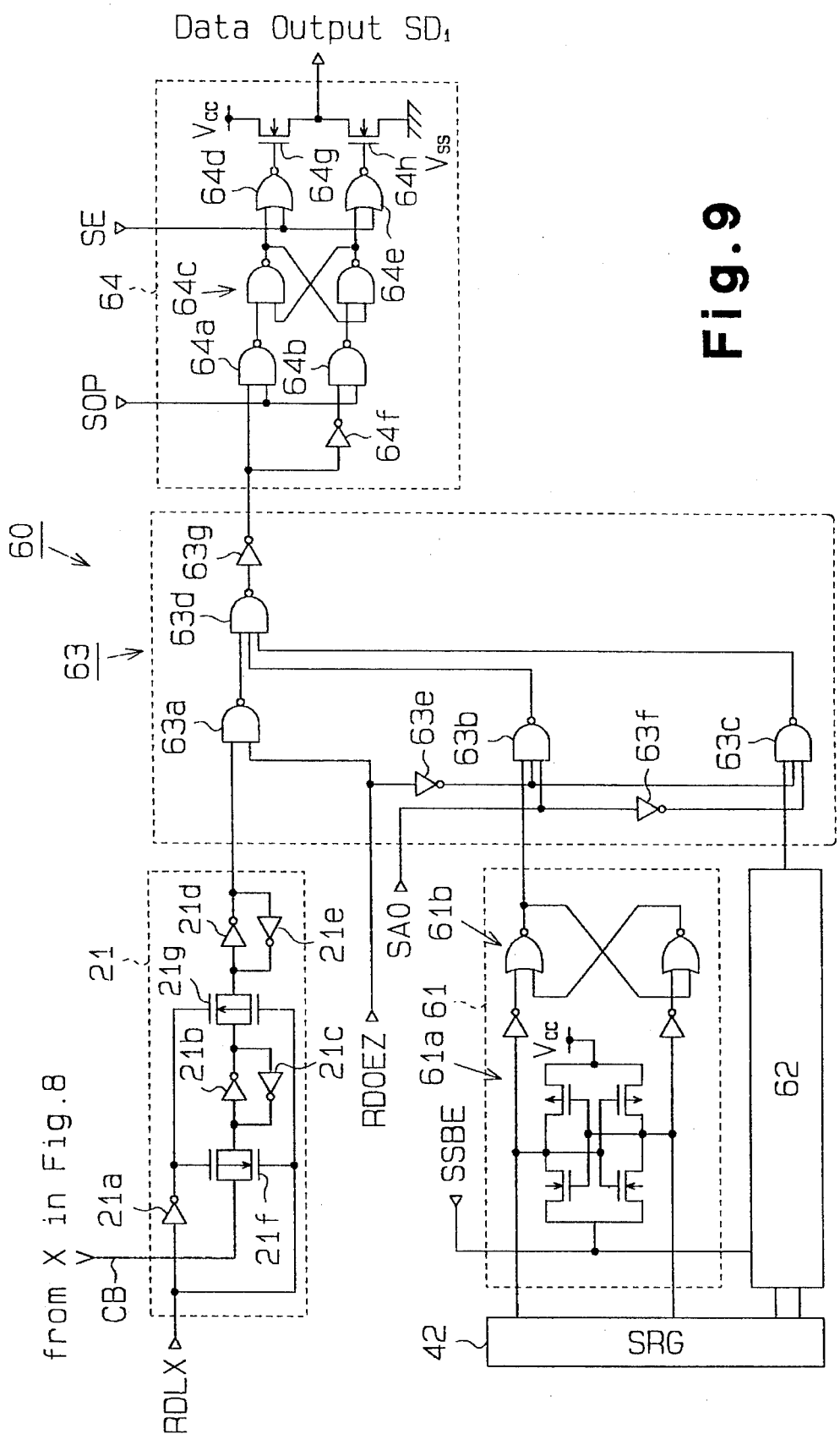
FIG. 9 is a diagram showing a reading circuit in a serial access memory section.

FIG. 9 presents the detailed illustration of one embodiment of a circuit section 60 for the SAM section 41 which is designed in accordance with the present invention. The latch circuit 21 includes five inverters 21a to 21e and two transfer gate 21f and 21g. Each of the transfer gates 21f and 21g is constituted of PMOS and NMOS transistors. The switching of both transfer gates 21f and 21g is controlled based on a control signal RDLX from the input circuit 33. The input circuit 33 generates an H-level control signal RDLX in response to the rising of the row address strobe signal /RAS, and generates an L-level control signal RDLX in response to the rising of a data transfer signal /DT. That is, the input circuit 33 outputs the H-level control signal RDLX in transfer mode. When the read transfer to the SRG 42 from the MCA 51 starts, the input circuit 33 sets the control signal RDLX low.

The control signal RDLX is input to the gate of the NMOS transistor of the transfer gate 21f and to the gate of the PMOS transistor of the transfer gate 21g. The control signal RDLX is input via the inverter 21a to the gate of the PMOS transistor of the transfer gate 21f and the gate of the NMOS transistor of the transfer gate 21g. When the control signal RDLX has a high level, therefore, the transfer gate 21f is turned on and the transfer gate 21g is turned off.

In transfer mode (i.e., when the control signal RDLX is set high), the transfer gate 21f is turned on so that the data signal on the common bus CB is input to the inverters 21b and 21c. When the read transfer starts subsequently (i.e., when the control signal RDLX is set low), the transfer gate 21f is turned off and the transfer gate 21g is turned on. Consequently, the data signal from the common bus CB is latched by the inverters 21b and 21c and is supplied via the inverters 21d and 21e to a common bus driver 63.

First and second sense buffers 61 and 62, which are of a latch type, receive data from the SRG 42. The first sense buffer 61 includes a latch circuit 61a and a flip-flop circuit 61b. The latch circuit 61a is connected to the high-potential power supply $V_{CC}$ and receives an enable signal SSBE. In response to an L-level enable signal SSBE, the first sense buffer 61 is enabled. The enabled first sense buffer 61 latches the data signal from the SRG 42 and supplies it to the common bus driver 63 via the flip-flop 61b. The second sense buffer 62 has the same structure as the first sense buffer 61.

The common bus driver 63 includes four NAND gates 63a to 63d and three inverters 63e to 63g. The NAND gate 63a receives the data signal from the latch circuit 21 and a control signal RDOEZ from the input circuit 33. The input circuit 33 generates the control signal RDOEZ which goes high for a predetermined period of time from the rising of the data transfer signal /DT.

The H-level duration of the control signal RDOEZ is set longer than the time during which data, associated with the initial address, is read from the SRG 42 based on the system clock SC. The H-level duration of the control signal RDOEZ is so set as to become the L-level before data, associated with the next address to the initial address, is read from the SRG 42 based on the system clock SC. While the control signal RDOEZ has an H level, therefore, the NAND gate 63a keeps outputting the signal corresponding to the data signal latched by the latch circuit 21, to the NAND gate 63d.

The NAND gate 63b receives the data signal from the first sense buffer 61, the serial address signal $SA_0$ and the control signal RDOEZ, supplied via the inverter 63e. When the serial address signal $SA_0$ is set high and the control signal RDOEZ is set low, the NAND gate 63b outputs a signal corresponding to the data signal from the first sense buffer 61 to the NAND gate 63d.

The NAND gate 63c receives the data signal from the second sense buffer 62, the serial address signal $SA_0$, supplied via the inverter 63f, and the control signal RDOEZ, supplied via the inverter 63e. When the serial address signal $SA_0$ is set low and the control signal RDOEZ is set low, the NAND gate 63c outputs a signal corresponding to the data signal from the second sense buffer 62, to the NAND gate 63d.

Therefore, the NAND gate 63d receives the data signal, latched in the latch circuit 21, when the control signal RDOEZ has an H level, and receives the data signal, latched in the first sense buffer 61 or the second sense buffer 62, when the control signal RDOEZ has an L level. The NAND gate 63d provides the output buffer 64 with the received data signal via the inverter 63g.

The output buffer 64 includes two NAND gates 64a and 64b, a flip-flop circuit 64c, two NOR gates 64d and 64e, an inverter 64f and two output transistors 64g and 64h. The NAND gate 64a receives a control signal SOP from the input circuit 33 and a data signal from the common bus driver 63. The NAND gate 64b receives the control signal SOP from the input circuit 33 and a data signal, which is supplied via the inverter 64f from the common bus driver 63. The input circuit 33 generates the control signal SOP based on the system clock SC.

The outputs of the NAND gates 64a and 64b are supplied to the NOR gates 64d and 64e via the flip-flop 64c. Both NOR gates 64d and 64e receive a serial enable signal SE from the input circuit 33. The input circuit 33 generates the serial enable signal SE based on an externally supplied serial enable signal /SE. It should be noted that the signals SOP and SE cooperate with common bus driver 63 and SAM output buffer 64 to serially output data SD, as depicted in FIG. 9 taken in conjunction with FIG. 10.

The output terminal of the NOR gate 64d is connected to the gate of the NMOS output transistor 64g, and the output terminal of the NOR gate 64e is connected to the gate of the NMOS output transistor 64h. The transistors 64g and 64h are connected in series between the high-potential power supply $V_{CC}$ and low-potential power supply $V_{SS}$. A node between the transistors 64g and 64h serves as the output terminal of the output buffer 64.

When the serial enable signal SE has an L level, the NOR gates 64d and 64e respectively output signals corresponding to the input data signals, to the output transistors 64g and 64h. Based on the outputs, one of the transistors 64g and 64h is turned on and the other transistor is turned off, thus producing serial output data $SD_1$. When the serial enable signal SE has an H level, the NOR gates 64d and 64e respectively output L-level signals to the transistors 64g and 64h, thus turning off both transistors 64g and 64h. Consequently, the output terminal of the output buffer 64 becomes a high-impedance state.

In read transfer mode, the row address strobe signal /RAS falls while the L-level data transfer signal /DT is externally supplied to the input circuit 33, as shown in FIGS. 10A–10J. In response to the falling of this strobe signal /RAS, the input circuit 33 outputs the H-level control signal RDLX.

In response to the falling of the row address strobe signal /RAS, the row address buffer 35 produces row address signals $RA_0$ to $RA_8$ from the address signals $A_0$ to $A_8$. The row decoder 36 selects one word line WL based on the row address signals $RA_0$–$RA_8$. Cell data are output on a bit line pair BL and /BL from the memory cells which are connected to the selected word line WL. The sense amplifier 38 amplifies the data signals on the bit line pair BL and /BL.

Next, the column address buffer 34 produces column address signals $CA_0$ to $CA_8$ in response to the falling of the column address strobe signal /CAS and outputs the signals $CA_0$–$CA_8$ to the column decoder 37 and the serial address counter 45. Consequently, one of the blocks 32a and 32b is selected in accordance with the potential level of the column address signal $CA_8$ first. The column decoder 37 selects two bit line pairs BL and /BL based on the column address signals $CA_0$–$CA_8$. Cell data are output to the first and second sense buffers 52 and 53 via the selected two bit line pairs BL and /BL, and first and second data bus line pairs $DB_1$ and /$DB_1$ and $DB_2$ and /$DB_2$.

The first and second sense buffers 52 and 53 amplify the supplied data signals and output the resultant signals to the selector 71. One of the transfer gates 71a and 71b in the selector 71 is turned on in response to the column address signal $CA_0$, and the data signal is output to the common bus driver 54 via the enabled transfer gate 71a or 71b and the inverter 72.

The common bus driver 54 which has been enabled based on the enable signal BKS0Z or BKS1Z outputs the received data signal to the output buffer 55 and the latch circuit 21 via the common bus CB. The latch circuit 21 latches the data signal in response to the control signal RDLX from the input circuit 33, and outputs it to the common bus driver 63.

The transfer controller 44 turns on the transfer gates 43 just for a predetermined period of time in response to the rising of the data transfer signal /DT. During this period, cell data is transferred to the serial register group 42 from the memory section 32 via the transfer gate group 43. The individual registers 42a in the serial register group 42 store the transferred data.

The serial address counter 45 produces the serial address signals $SA_0$–$SA_8$ which specifies the initial address, based on the column address signals $CA_0$–$CA_8$, and outputs them to the serial decoder 46. In accordance with the serial address signals $SA_0$–$SA_8$, the serial decoder 46 outputs the data stored in the two registers 42a to the first and second sense buffers 61 and 62 via the serial data bus line pairs $SDB_1$ and $/SDB_1$ and $SDB_2$ and $/SDB_2$. The first and second sense buffers 61 and 62 latch the data signals from those registers 42a and output the latched signals to the common bus driver 63.

The common bus driver 63 receives the data signals, latched in the latch circuit 21 and the first and second sense buffers 61 and 62, based on the serial address signal $SA_0$ and the control signal RDOEZ. When the control signal RDOEZ has an H level (when the initial address is designated), the common bus driver 63 supplies the data signal from the latch circuit 21 to the output buffer 64, which in turn outputs the signal as head data. When the control signal RDOEZ is set low, the common bus driver 63 selectively receives the data from the first and second sense buffers 61 and 62 based on the serial address signal $SA_0$, and outputs the selected data to the output buffer 64. This data is output as serial output data $SD_1$.

According to this embodiment, as described above, the single latch circuit 21 is connected to the common bus CB provided in the RAM section. In reading data corresponding to the initial address from the serial register 42, the first and second sense buffers 52 and 53 amplify data read from the memory cells in accordance with the column address signals $CA_0$–$CA_8$ which specifies the initial address. One of the data signals amplified by the first and second sense buffers 52 and 53 is selected in accordance with the potential level of the column address signal $CA_0$. The selected data is latched by the latch circuit 21, and is supplied to the common bus driver 63 as data which has been read in accordance with the initial address. This data is output as serial output data $SD_1$ from the output buffer 64.

Figure 2:
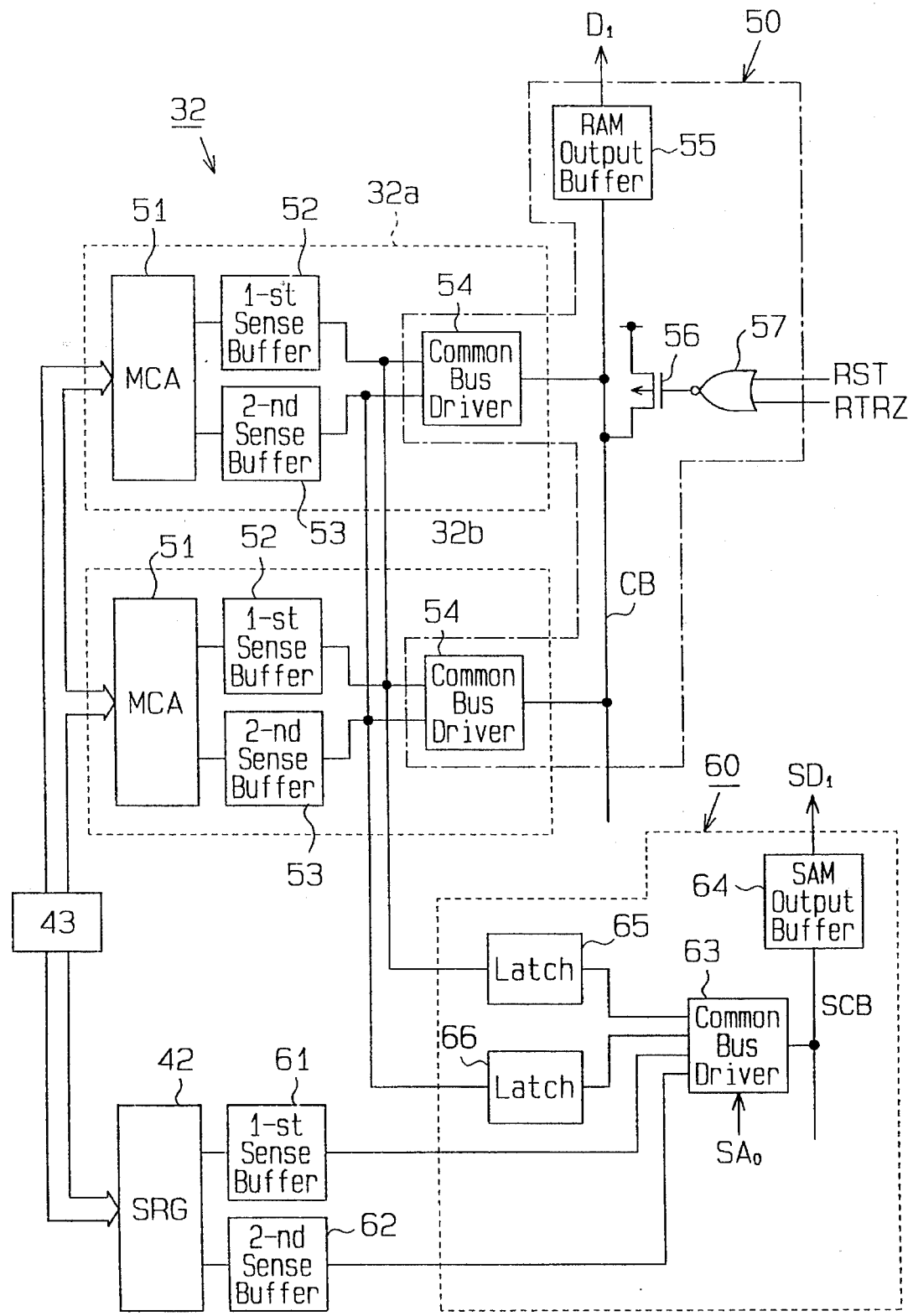
FIG. 2 is a circuit diagram showing a data reading section in the VRAM in FIG. 1.
Figure 3:
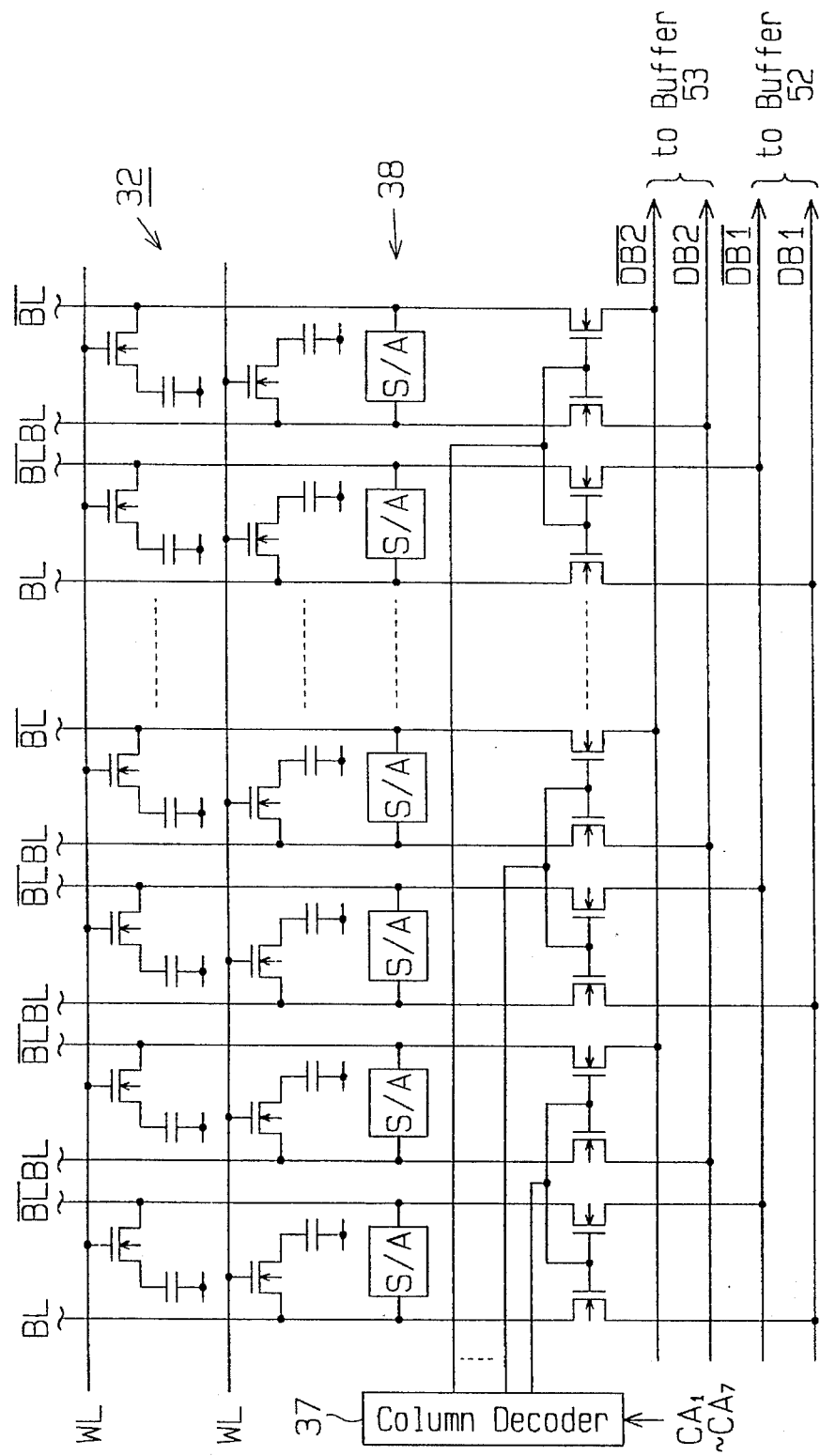
FIG. 3 is a circuit diagram showing a part of a cell array in the VRAM in FIG. 1.
Figure 4:
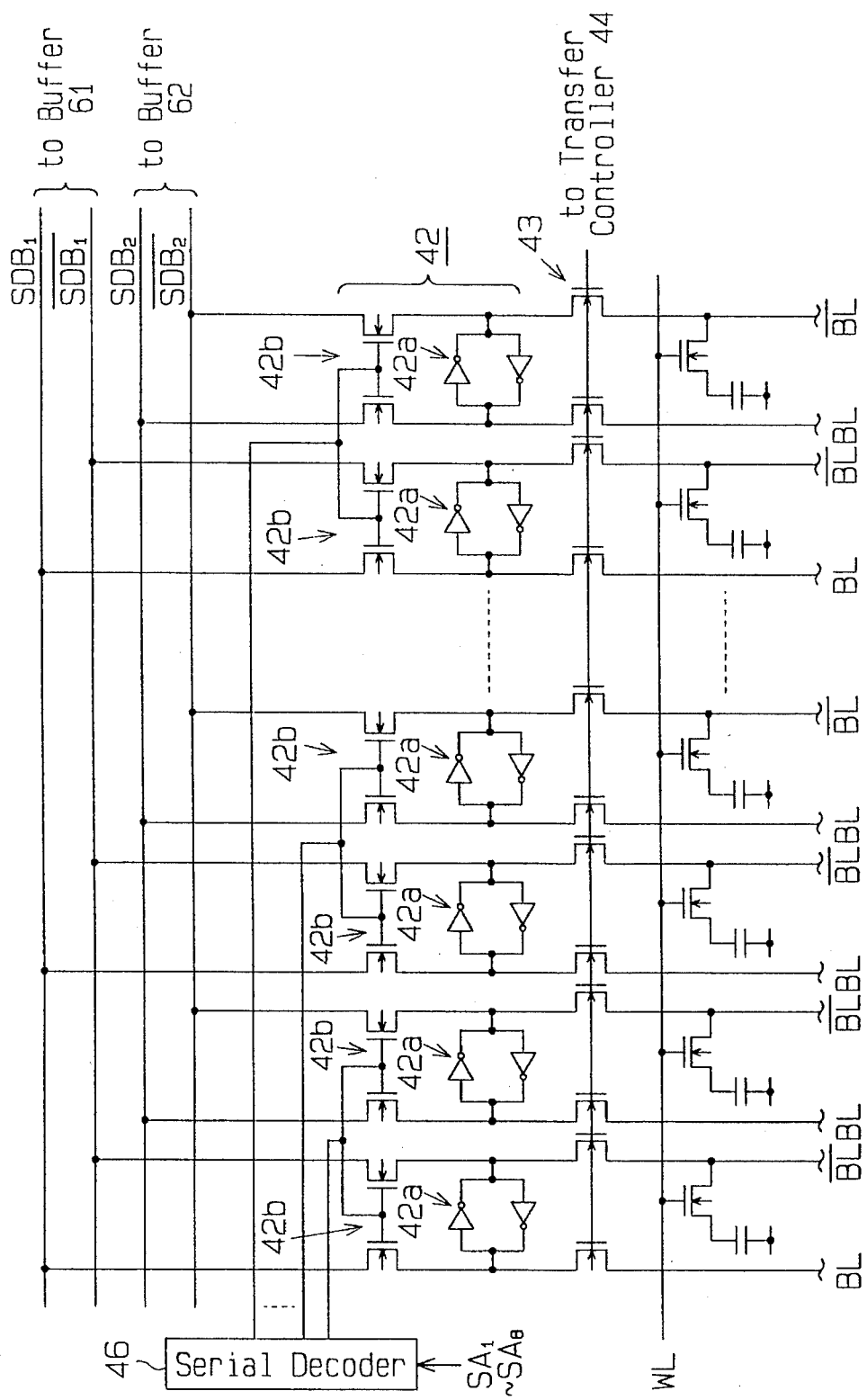
FIG. 4 is a circuit diagram showing a serial register in the VRAM in FIG. 1.
Figure 5:
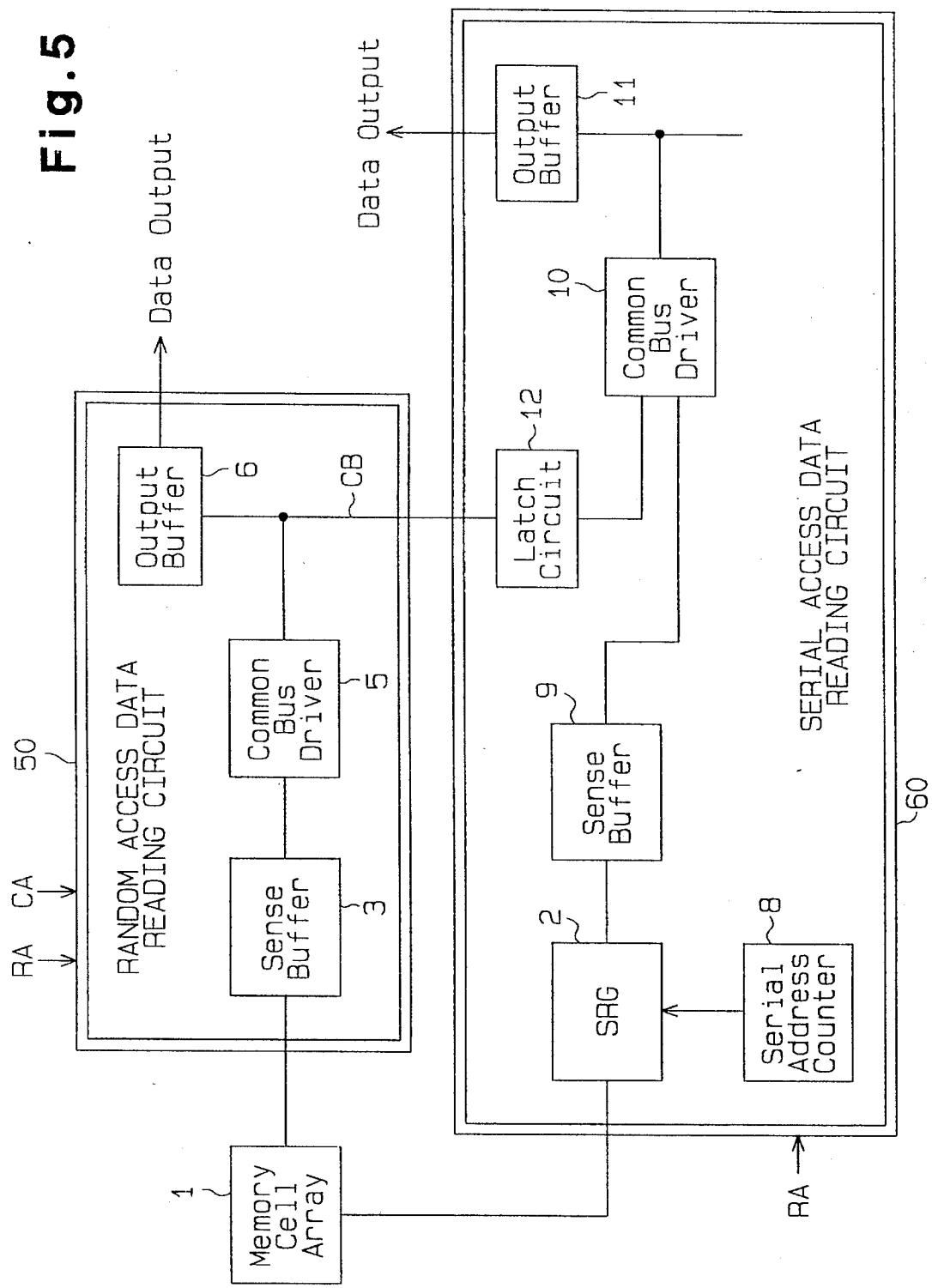
FIG. 5 is a schematic diagram showing the essential parts of a semiconductor device according to this invention.

The provision of the single latch circuit 21 shortens the time for reading data from the serial register group 42, and contributes to reducing the circuit area needed for the latch circuit as compared with the conventional art which requires two latch circuits 65 and 66 as shown in FIG. 2. Furthermore, in reducing the parts count of the circuit by using a single latch circuit in the place of a pair of latch circuits, the reliability of the overall circuit is improved.

Although only one embodiment of the present invention has been described herein, it should be apparent to those skilled in the art that the present invention may be embodied in many other specific forms without departing from the spirit or scope of the invention. Particularly, it should be understood that although the above-described embodiment relates to a RAM of an 8-bit output type, this invention may be adapted for a VRAM of a 1-bit output type, a 2-bit output type or a 16-bit output type.

Therefore, the present example and embodiment are to be considered as illustrative and not restrictive and the invention is not to be limited to the details given herein, but may be modified within the scope of the appended claims.

What is claimed is:

1. A semiconductor memory device including a memory cell array having a plurality of memory cells connected to a plurality of word lines, said device comprising:

a random access data reading circuit, coupled to said memory cell array, for reading cell data from a memory cell selected based on a row address signal and a column address signal, said reading circuit including a random access sense buffer and a random access common bus driver, coupled to said memory cell array, and a random access output buffer connected via a common bus to said random access common bus driver; and a serial access data reading circuit, coupled to said memory cell array, for reading cell data from memory cells, connected to a word line of the memory cell array selected based on the row address signal in a read transfer mode, wherein said serial access data reading circuit includes:

a serial address counter;

a plurality of serial registers for storing data supplied from individual memory cells as read from said selected word line;

a serial access sense buffer, coupled to said plurality of serial registers, for receiving data signal selectively supplied from said serial registers in accordance with an address value of said serial address counter;

a latch circuit, connected to said common bus of said random access data reading circuit, for latching an initial data signal placed on said common bus by said random access common bus driver in said read transfer mode;

a serial access output buffer; and a serial access common bus driver, coupled to said serial access sense buffer, said latch circuit and said serial access output buffer, for supplying said initial data signal latched in said latch circuit to said serial access output buffer first, and then supplying data signals from said serial registers to said serial access output buffer via said serial access sense buffer.

2. The semiconductor memory device according to claim 1, wherein said semiconductor memory device is an image memory.

3. A semiconductor memory device comprising:

a memory cell array having a plurality of memory cells connected to a plurality of word lines and a plurality of bit line pairs;

first and second sense buffers coupled to said memory cell array, for amplifying cell data signals read from said memory cell array;

a common bus;

a random access common bus driver for selectively outputting data signals supplied from said first and second sense buffers onto said common bus;

a random access output buffer, connected to said common bus, for outputting said common bus data signal on said common bus to an external unit;

a transfer gate, coupled to said memory cell array, for passing and transferring data, stored in a word line which is selected based on an externally supplied row address signal;

a serial address counter for setting an initial address for head data based on a column address signal, and counting the number of pulses of a system clock signal to sequentially generate serial addresses computed based on a count value and said initial address;

a plurality of serial registers for storing data sequentially transferred from said memory cell array via said transfer gate in response to said serial addresses;

a serial access sense buffer for sensing and latching said transferred data from said serial registers;

a latch circuit, connected directly to said common bus, for latching data signals output from said random access common bus driver, a serial access common bus driver coupled to said serial access sense buffer and said latch circuit;

a serial access output buffer, coupled to said serial access common bus driver, for outputting serial output data;

wherein said latch circuit latches data, read from said memory cell array in accordance with said initial address, as head data, and said serial access common bus driver selects said head data, latched in said latch circuit, as data to be supplied to said serial access output buffer when a specified address is said initial address and, thereafter, selects data latched in said serial access sense buffer when said specified address is an address following said initial address.

4. The semiconductor memory device according to claim 3, wherein said common bus is connected via a reset transistor to a power supply, said reset transistor being switched by a reset signal based on a row address strobe signal.

5. The semiconductor memory device according to claim 3, wherein said semiconductor memory device is an image memory.

6. A method of outputting data from a semiconductor memory device in a serial form, comprising the steps of:

selecting one of a plurality of memory cells of a memory cell array, based on a row address signal and on a column address signal;

reading data from said selected memory cell via a common bus driver for random accessing and an output buffer for random accessing;

storing data, read from memory cells, connected to a word line selected based on said row address signal, into serial registers;

reading data from said serial registers via a common bus driver for serial accessing and an output buffer for serial accessing, in accordance with an address designated by a serial address counter;

latching data, output from said random access common bus driver, as head data of serial data in a read transfer mode; and outputting data stored in said serial registers via said serial access output buffer after said latched head data has been output from said serial access output buffer.

7. In a semiconductor memory device having data addressably stored in a memory, said data including head data stored at a predetermined memory location, a method of outputting said data in a serial form from said memory in which the first data to be output includes said head data, said method comprising the steps of:

storing data read from said memory in a plurality of serial registers;

outputting said head data directly from said predetermined memory address onto a common bus;

latching said head data from said common bus;

outputting the latched head data to an output buffer; and thereafter, outputting said data in a serial form from said serial registers to said output buffer.

8. A semiconductor memory device comprising:

a memory having a plurality of memory cells for storing data and being arranged for addressing by rows and columns;

a random access data reading circuit, coupled to said memory, for reading said data based on a row address signal and a column address signal and then outputting said data which has been read to a common bus;

a latch circuit including an input connected directly to said common bus for latching initial data from an initial address in the memory when the initial data is placed on the common bus by the random access data reading unit and for outputting said initial data to an output section; and a serial access data reading circuit, coupled to said memory, for reading and storing a segment of said data based on said initial address and for outputting said data from said segment to said output section;

such that initial data previously latched in said latch circuit is supplied to said output section first, and thereafter, stored data from said segment is sequentially supplied to the output section by said serial access data reading circuit.

9. The semiconductor memory device according to claim 8 wherein said latch circuit includes one output to said output section.

* * * * *